US008922206B2

(12) United States Patent
Friedrich et al.

(10) Patent No.: US 8,922,206 B2
(45) Date of Patent: Dec. 30, 2014

(54) MAGNETIC FIELD SENSING ELEMENT COMBINING A CIRCULAR VERTICAL HALL MAGNETIC FIELD SENSING ELEMENT WITH A PLANAR HALL ELEMENT

(75) Inventors: Andreas P. Friedrich, Metz-Tessy (FR); Andrea Foletto, Annecy (FR); Gary T. Pepka, Pembroke, NH (US)

(73) Assignee: Allegro Microsystems, LLC, Worcester, MA (US)

( * ) Notice: Subject to any disclaimer, the term of this patent is extended or adjusted under 35 U.S.C. 154(b) by 198 days.

(21) Appl. No.: 13/226,694

(22) Filed: Sep. 7, 2011

(65) Prior Publication Data

US 2013/0057257 A1 Mar. 7, 2013

(51) Int. Cl.
*G01R 33/07* (2006.01)
*H01L 27/22* (2006.01)

(52) U.S. Cl.
CPC .................................. *G01R 33/077* (2013.01)
USPC .................... 324/251; 257/427; 257/E43.003

(58) Field of Classification Search
CPC .. G01R 33/077; G01R 33/023; G01R 33/029; G01R 33/041; G01R 33/075
USPC ............ 324/251, 247, 207.2, 207.14, 117 H, 324/249, 252
See application file for complete search history.

(56) References Cited

U.S. PATENT DOCUMENTS

| 4,668,914 | A | 5/1987 | Kersten et al. |
| 4,761,569 | A | 8/1988 | Higgs |
| 4,829,352 | A | 5/1989 | Popovic et al. |
| 5,073,858 | A | * 12/1991 | Mills ............................. 600/410 |
| 5,541,506 | A | 7/1996 | Kawakita et al. |
| 5,572,058 | A | 11/1996 | Biard |
| 5,612,618 | A | 3/1997 | Arakawa |
| 5,619,137 | A | 4/1997 | Vig et al. |
| 5,621,319 | A | 4/1997 | Bilotti et al. |
| 5,657,189 | A | 8/1997 | Sandhu |
| 5,694,038 | A | 12/1997 | Moody et al. |
| 5,831,513 | A | 11/1998 | Lue |
| 5,844,411 | A | 12/1998 | Vogt |
| 5,942,895 | A | 8/1999 | Popovic et al. |
| 6,064,199 | A | 5/2000 | Walter et al. |
| 6,064,202 | A | 5/2000 | Steiner et al. |

(Continued)

FOREIGN PATENT DOCUMENTS

DE   10 2005 014 509 B4   10/2006
DE   10 2006 037 226        2/2008

(Continued)

OTHER PUBLICATIONS

PCT Invitation to Pay Additional Fees with Partial Search Report; dated Feb. 4, 2013; for PCT Pat. App. No. PCT/US2012/050074; 7 pages.

(Continued)

*Primary Examiner* — Bot Ledynh
(74) *Attorney, Agent, or Firm* — Daly, Crowley, Mofford & Durkee, LLP

(57) ABSTRACT

A magnetic field sensor includes a circular vertical Hall (CVH) sensing element and at least one planar Hall element. The CVH sensing element has contacts arranged over a common implant region in a substrate. In some embodiments, the at least one planar Hall element is formed as a circular planar Hall (CPH) sensing element also having contacts disposed over the common implant region. A CPH sensing element and a method of fabricating the CPH sensing element are separately described.

21 Claims, 8 Drawing Sheets

(56) References Cited

U.S. PATENT DOCUMENTS

| | | | |
|---|---|---|---|
| 6,091,239 A | 7/2000 | Vig et al. | |
| 6,100,680 A | 8/2000 | Vig et al. | |
| 6,166,535 A | 12/2000 | Irle et al. | |
| 6,232,768 B1 | 5/2001 | Moody et al. | |
| 6,236,199 B1 | 5/2001 | Irle et al. | |
| 6,265,864 B1 | 7/2001 | De Winter et al. | |
| 6,278,271 B1 | 8/2001 | Schott | |
| 6,288,533 B1 | 9/2001 | Haeberli et al. | |
| 6,297,627 B1 | 10/2001 | Towne et al. | |
| 6,356,741 B1 | 3/2002 | Bilotti et al. | |
| 6,525,531 B2 | 2/2003 | Forrest et al. | |
| 6,542,068 B1 | 4/2003 | Drapp et al. | |
| 6,545,462 B2 | 4/2003 | Schott et al. | |
| 6,622,012 B2 | 9/2003 | Bilotti et al. | |
| 6,768,301 B1 | 7/2004 | Hohe et al. | |
| 6,969,988 B2 | 11/2005 | Kakuta et al. | |
| 7,030,606 B2 | 4/2006 | Kato et al. | |
| 7,038,448 B2 | 5/2006 | Schott et al. | |
| 7,085,119 B2 | 8/2006 | Bilotti et al. | |
| 7,119,538 B2 | 10/2006 | Blossfeld | |
| 7,159,556 B2 | 1/2007 | Yoshihara | |
| 7,235,968 B2 | 6/2007 | Popovic et al. | |
| 7,259,556 B2 | 8/2007 | Popovic et al. | |
| 7,307,824 B2 | 12/2007 | Bilotti et al. | |
| 7,362,094 B2 | 4/2008 | Voisine et al. | |
| 7,714,570 B2 | 5/2010 | Thomas et al. | |
| 7,746,065 B2 | 6/2010 | Pastre et al. | |
| 7,759,929 B2 | 7/2010 | Forsyth | |
| 7,872,322 B2 | 1/2011 | Schott et al. | |
| 7,911,203 B2 | 3/2011 | Thomas et al. | |
| 7,965,076 B2 | 6/2011 | Schott | |
| 7,994,774 B2 | 8/2011 | Thomas et al. | |
| 2006/0011999 A1 | 1/2006 | Schott et al. | |
| 2007/0029998 A1 | 2/2007 | Popovic et al. | |
| 2009/0058412 A1* | 3/2009 | Taylor et al. | 324/252 |
| 2009/0121707 A1 | 5/2009 | Schott | |
| 2009/0174395 A1 | 7/2009 | Thomas et al. | |
| 2010/0156397 A1 | 6/2010 | Yabusaki et al. | |
| 2010/0164491 A1 | 7/2010 | Kejik et al. | |
| 2011/0031960 A1* | 2/2011 | Hohe et al. | 324/202 |
| 2011/0248708 A1 | 10/2011 | Thomas et al. | |

FOREIGN PATENT DOCUMENTS

| | | |
|---|---|---|
| DE | 10 2006 037 226 A1 | 2/2008 |
| EP | 0 631 416 B1 | 12/1994 |
| EP | 0 875 733 B1 | 11/1998 |
| EP | 0 916 074 B1 | 5/1999 |
| EP | 0 947 846 A2 | 10/1999 |
| EP | 0 947 846 A3 | 10/1999 |
| EP | 2 000 813 A1 | 12/2008 |
| EP | 2 000 814 A2 | 12/2008 |
| EP | 2 000 816 A1 | 12/2008 |
| JP | 58-055688 A | 4/1983 |
| JP | 2003-042709 | 2/2003 |
| JP | 2005-241269 | 9/2005 |
| JP | 2010-014607 | 1/2010 |
| JP | 2010-078366 | 4/2010 |
| WO | WO 98/10302 | 3/1998 |
| WO | WO 98/54547 | 12/1998 |
| WO | WO 00/02266 | 1/2000 |
| WO | WO 01 18556 A1 | 3/2001 |
| WO | WO 03/036732 A2 | 5/2003 |
| WO | WO 2004/025742 | 3/2004 |
| WO | WO 2006/056289 A1 | 6/2006 |
| WO | WO 2006/074989 A2 | 7/2006 |
| WO | WO 2008 145662 A1 | 12/2008 |
| WO | WO 2009 030361 A1 | 3/2009 |
| WO | WO 2009/124969 A1 | 10/2009 |

OTHER PUBLICATIONS

Petrie; "Circular Vertical Hall Magnetic Field Sensing Element and Method with a Plurality of Continuous Output Signals;" U.S. Appl. No. 13/035,243, filed Feb. 25, 2011; 56 pages.

Rournenin et al.; "Vertical Hall Effect Devices in the Basis of Smart Silicon Sensors;" IEEE Workshop on Intelligent Data Aquisition and Advanced Computing Systems: Technology and Applications; Sep. 5-7, 2005; pp. 55-58.

PCT Search Report and Written Opinion of the ISA; dated May 3, 2013; for PCT Pat. App. No. 2012-050074; 24 pages.

Allegro Microsystems, Inc.; "High Precision Linear Hall Effect Sensor IC with a Push/Pull, Pulse Width Modulated Output;" A1351; pp. 1-23.

Allegro Microsystems, Inc., "High Precision 2-Wire Linear Hall Effect Sensor IC with a Pulse Width Modulated Output;" A1354; pp. 1-22.

Allegro Microsystems, Inc.; "High Precision Linear Hall-Effect Sensor with an Open Drain Pulse Width Modulated Output;" A1356; pp. 1-20.

Allegro Microsystems, Inc.; "Low-Noise Programmable Linear Hall Effect Sensor IC's with Adjustable Bandwidth (50 kHz Maximum) and Analog Output;" A1360, A1361 and A1362; pp. 1-25.

Baschirotto et al.; A.;"Development and Analysis of a PCB Vector 2-D Magnetic Field Sensor System for Electronic Compasses;" IEEE Sensors Journal, vol. 6, No. 2; Apr. 2006; pp. 365-371.

Kejik, P. et al.; "Purley CMOS Angular Position Sensor Based on a New Hall Microchip;" $34^{th}$ Annual Conference of IEEE Industrial Electronics; IECON; Nov. 10-13, 2008; pp. 1777-1781.

Kejik, P.et al.; "Ultra Low-Power Angular Position Sensor for High-Speed Portable Applications;" 2009 IEEE Sensors Conference; Oct. 25-28, 2009; pp. 173-176.

Reymond, S. et al.; "True 2D CMOS Integrated Hall Sensor," 2007 IEEE Sensors Conference; Oct. 28-31, 2007; pp. 860-863.

Gerhauser, H., "Intelligente 3D-Magnetfeld Snesorik;" Fraunhofer-Institut for Integrierte Schaltungen IIS; www.iis.fraunhofer.de/asic/analog; Oct. 2009; 2 pages.

Melexis Microelectronic Integrated Systems; MLX90333; "Triaxis 3D-Joystick Position Sensor;" Data Sheet; Mar. 2009; 43 pages.

Memsic Corporation; AN-00MM-004; "Electronic Tilt Compensation;" Mar. 2008; 5 pages.

Memsic Corporation; AN-00MM-003; "Magnetic Sensor Calibration;" Mar. 2008; 5 pages.

Memsic Corporation; AN-00MM-002; "Magnetometer Soldering Methodology;" Jun. 2008; 2 pages.

Memsic Corporation; AN-00MM-001; "Magnetometer Fundamentals;" Jun. 2008; 6 pages.

Memsic Corporation; AN-00MM-005; "Magnetic Sensor Placement Guidelines;" Oct. 2008; 2 pages.

Memsic Corporation; MMC312xMQ; "Tri-axis Magnetic Sensor, with $I^2C$ Interface;" Aug. 14, 2008; 9 pages.

Memsic Corporation; MMC314xMQ; "Ultra Small 3-axis Magnetic Sensor, with $I^2C$ Interface;" Mar. 31, 2010; 8 pages.

Micronas GmbH; "HAL® 3625 Programmable Direct Angle Sensor;" Product Information; Sep. 2009; 2 pages.

Allegro Microsystems, Inc.; "A1140/41/42/43 Data Sheet: Sensitive Two-Wire Chopper-Stabilized Unipolar Hall-Effect Switches;" published Sep. 9, 2004; pp. 1-11.

Allegro Microsystems, Inc.; "A1174 Data Sheet: Ultrasensitive Hall Effect Latch with Internally or Externally Controlled Sample and Sleep Periods for Track Ball and Scroll Wheel Applications;" published Jul. 25, 2008; pp. 1-13.

Allegro Microsystems, Inc.; "A1230 Data Sheet: Ultra-Sensitive Dual-Channel Quadrature Hall-Effect Bipolar Switch;" published Mar. 26, 2010; 16 sheets.

Allegro Microsystems, Inc.; "A1351 Data Sheet: High Precision Linear Hall Effect Sensor with a Push/Pull, Pulse Width Modulated Output;" published Mar. 7, 2008; pp. 1-23.

Allegro Microsystems, Inc.; "A1360, A1361 and A1362 Data Sheet: Low-Noise Programmable Linear Hall Effect Sensors with Adjustable Bandwidth (50 kHz Maximum) and Analog Output;" published Mar. 18, 2008; pp. 1-25.

Allegro Microsystems, Inc.; "A3212 Data Sheet: Micropower, Ultra-Sensitive Hall-Effect Switch;" published Sep. 22, 2004; pp. 1-12.

Allegro Microsystems, Inc.; "ATS675LSE Data Sheet: Self-Calibrating TPOS Speed Sensor Optimized for Automotive Cam Sensing Applications;" published Jul. 11, 2008; pp. 1-13.

(56) References Cited

OTHER PUBLICATIONS

Allegro Microsystems, Inc.; "27701-AN Data Sheet: Hall-Effect IC Applications Guide;" Application Information, Rev. 2; http://www.allegromicro.com/en/products/desipn/hall-effect-sensor-ic-applications-guide/AN27701.pdf; downloaded Sep. 29, 2010; pp. 1-40.

Allegro Microsystems, Inc.; "3235 Data Sheet 27633A, Dual-Output Hall-Effect Switch;" http://vvww.datasheetcatalog.orc/datasheets/90/205047_DS.pdf; downloaded Sep. 29, 2010; 6 sheets.

Allegro Microsystems, Inc.; "A3425 Data Sheet: Dual, Chopper-Stabilized, Ultra-Sensitive Bipolar Hall-Effect Switch;" published Jun. 28, 2002; pp. 1-10.

Atherton et al.; "Sensor Signal Conditioning—an IC Designer's Perspective;" IEEE Electro International; Apr. 26-28, 1991; pp. 129-134.

Austria Microsystems; "AS5040 datasheet; 10-Bit Programmable Magnetic Rotary Encoder;" Revision 1.1; Jan. 2004; pp. 1-20.

Banjevic et al; "2D CMOS Integrated Magnetometer Based on the Miniaturized Circular Vertical Hall Device;" International Solid-State Sensors, Actuators and Microsystems Conference; Transducers; Jun. 21-25, 2009; pp. 877-880.

Blanchard et al.; "Cylindrical Hall Device;" International Electron Devices Meeting; Dec. 8-11, 1996; pp. 541-544

Burger et al.; "New fully integrated 3-D silicon Hall sensor for precise angular-position measurements;"Sensors and Actuators, A 67; May 1998; pp. 72-76.

Dwyer; Allegro Microsystems, Inc.; "AN296061 Data Sheet: Ring Magnet Speed Sensing for Electronic Power Steering;" published Jul. 21, 2009; pp. 1-4.

Freitas et al.; "Giant magnetoresistive sensors for rotational speed control;" Jorunal of Applied Physics, vol. 85, No. 8; Apr. 15, 1999; pp. 5459-5461.

Gilbert; "Technical Advances in Hall-Effect Sensing;" Allegro Microsystems, Inc. Product Description; May 10, 2008; 7 sheets.

Häberli et al.; "Contactless Angle Measurements by CMOS Magnetic Sensor with on Chip Read-Out Circuit;" The $8^{th}$ International Conference on Solid-State Sensors and Actuators and Eurosensors IX; Jan. 25-29, 1995; pp. 134-137.

Häberli et al.; "Two-Dimensional Magnetic Microsensor with On-Chip Signal Processing for Contactless Angle Measurement;" IEEE Journal of Solid-State Circuits, vol. 31, No. 12; Dec. 1996; pp. 1902-1907.

Hiligsmann et al.; "Monolithic 360 Degrees Rotary Position Sensor IC;" 2004 IEEE Proceedings of Sensors, vol. 3; Oct. 24-27, 2004; pp. 1137-1142.

Kejik et al.; "Circular Hall Transducer for Angular Position Sensing;" International Solid-State Sensors, Actuators and Microsystems Conference; Transducers; Jun. 2007; pp. 2593-2596.

Lou Law; "Angle Position Sensing with 2-Axis Hall ICs;" Sensors Magazine, vol. 20, No. 3; Mar. 2003; 7 sheets.

Masson et al.; "Multiturn and high precision through-shaft magnetic sensors;" Sensor + Text Conference; Proceedings II; May 2009; pp. 41-46.

Metz et al.; "Contactless Angle Measurement Using Four Hall Devices on Single Chip;"; International Conference on Solid State Sensors and Actuators; Transducers; vol. 1; Jun. 16-19, 1997; pp. 385-388.

Munter; "A Low-offset Spinning-current Hall Plate;" Sensors and Actuators, vol. A21-A23; Jan. 1990; pp. 743-746.

Novotechnik Siedle Group; "How New Angular Positioning Sensor Technology Opens a Broad Range of New Applications;" Vert-X Technology; Dec. 2001; pp. 1-5.

Paranjape et al.; "A CMOS-compatible 2-D vertical Hall magnetic-field sensor using active carrier confinement and post-process micromachining;" The $8^{th}$ International Conference on Solid-State Sensors and Acutators, Physical vol. 53, Issues 1-3; May 1996; pp. 278-283.

Petoussis et al.; "A Novel Hall Effect Sensor Using Elaborate Offset Cancellation Method;" Sensors & Transducers Journal, vol. 100, Issue 1; Jan. 2009; pp. 85-91.

Popovic; "Not-plate-like Hall magnetic sensors and their applications;" Sensors and Actuators A: Physical, vol. 85, Issues 1-3; Aug. 2000; pp. 9-17.

Roumenin et al.; "Vertical Hall Effect Devices in the Basis of Smart Silicon Sensors;" IEEE Workshop on Intelligent Data Acquisition and Advanced Computing Systems: Technology and Applications; Sep. 5-7, 2005; pp. 55-58.

Roumenin; "Magnetic sensors continue to advance towards perfection;" Sensors and Actuators A: Physical, vol. 46-47, Issues 1-3; Jan.-Feb. 1995; pp. 273-279.

Schneider et al.; "Temperature Calibration of CMOS Magnetic Vector Probe for Contactless Angle Measurement System;" International Electron Devices Meeting; Dec. 8-11, 1996; pp. 533-536.

Sensima technology sa; "CVHD: a new concept of Angular Position Sensor;" Slide Presentation for Allegro Microsystems; Mar. 2009; 17 sheets.

Sentron; AN-101; "Angular position sensing with 2-Axis Hall IC 2SA-10;" Feb. 12, 2004; http://www.diegm.uniud.it/petrella/Azionamenti%20Elettrici%20ll/Sensori%20e%20trasduttori/Data%20Sheet%20-%202SA-10.pdf; pp. 1-7.

van der Meer; et al; "CMOS quad spinning-current Hall-sensor system for compass application;" IEEE Proceedings of Sensors, vol. 3; Oct. 24-27, 2004; pp. 1434-1437.

Vogelgesang et al.; Robert Bosch GmbH; "GMR sensors in automotive application;" CS-SNS/ECS Slides Presentation; Mar. 2, 2005; 16 sheets.

Volder; "The CORDIC Trigonometric Computing Technique;" The Institute of Radio Engineers, Inc.; IRE Transactions on Electronic Computers, vol. EC, Issue 3; Sep. 1959; pp. 226-230.

Drljaca, et al.; "Nonlinear Effects in Magnetic Angular Position Sensor With Integrated Flux Concentrator;" Proc. $23^{rd}$ International Conference on Microelectronics (MIEL 2002); vol. 1; NIS; Yugoslavia; May 12-15, 2002; pp. 223-226.

Melexis MLX 90324; ""Under-the-Hood" Triaxis Rotary Position feat. SENT Protocol;" 3901090324 Data Sheet; Dec. 2008; 40 pages.

Banjevic; "High Bandwidth CMOS Magnetic Sensors Based on the Miniaturized Circular Vertical Hall Device;" Sep. 2011; 153 pages.

Taiwan Office Action (with English translation) dated Aug. 1, 2014; for Taiwan Pat. App. No. 101129714: 16 pages.

PCT International Preliminary Report on Patentability and Written Opinion of the ISA dated Mar. 20, 2014; for PCT Pat. App. No. PCT/US2012/050074; 17 pages.

European Response to Official Cornmunication filed Sep. 5, 2014; for EP Pat. App. No. 12758680.8; 27 pages.

Letter to Taiwan International Patent & Law Office dated Oct. 16, 2014; for Taiwanese Pat. App. No. 101129714; 3 pages.

Translation of Claims as filed with Response filed Nov. 5, 2014; for Taiwanese Pat. App. No. 101129714; 4 pages.

\* cited by examiner

MAGNETIC FIELD SENSING ELEMENT COMBINING A CIRCULAR VERTICAL HALL MAGNETIC FIELD SENSING ELEMENT WITH A PLANAR HALL ELEMENT

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to magnetic field sensing elements for sensing a direction of a magnetic field and, more particularly, to a magnitude field sensing that combines a circular vertical Hall (CVH) magnetic field sensing element with a planar Hall element.

BACKGROUND OF THE INVENTION

Various types of magnetic field sensing elements are known, including Hall effect elements and magnetoresistance elements. Magnetic field sensors generally include a magnetic field sensing element and other electronic components.

Some magnetic field sensing elements and associated magnetic field sensors provide an electrical signal representative of a direction of a sensed magnetic field. The magnetic field signal varies in accordance with the direction in a way that can be resolved to identify a pointing direction of the magnetic field.

Most types of such direction-indicating magnetic field sensing elements and associated magnetic field sensors generate signals that are indicative of the direction of a component of the magnetic field in only two dimensions, i.e., in a plane. However, the magnetic field may have a pointing direction not parallel to the plane of sensitivity of the magnetic field sensor, i.e., in three dimensions.

Magnetic field sensor that can sense three dimensions of a magnetic field are useful in some applications, for example, in three dimensional joysticks, where the joystick can be moved in two dimensions and also can be depressed in a third dimension. Some three-dimensional applications use both a magnetic field sensor operable to provide a two-dimensional indication of a pointing direction of a magnetic field in a plane and also a separate one-dimensional magnetic field sensor operable to provide indication of a magnitude of a magnetic field in a direction perpendicular to the plane.

Thus, to resolve some of the three-dimensional characteristics of the magnetic field, some arrangements use both a two-dimensional magnetic field sensor and also a one-dimensional magnetic field sensor. In some applications, output signals from the two magnetic field sensors can be further processed to provide a signal representative of a magnitude of the magnetic field along the three-dimensional pointing direction of the magnetic field. Thus, by combining information generated by the two magnetic field sensors, three-dimensional characteristics of the magnetic field can be determined.

It is cumbersome to provide both the above-described two-dimensional magnetic field sensor and also the above described one-dimensional magnetic field sensor. A combination of two such magnetic field sensors tends to be expensive. Furthermore, additional processing is required to resolve the three-dimensional characteristics of the sensed magnetic field. Still further, alignment of the two types of magnetic field sensors to provide orthogonal axes is critical to the accuracy of the resulting resolved three-dimensional characteristics, and such alignment can be difficult and inaccurate.

Therefore, it would be desirable to provide a single integrated magnetic field sensing element and associated magnetic field sensor that can generate a signal or signals that is/are indicative of characteristics of a magnetic field in three dimensions. In some embodiments, the integrated magnetic field sensing element is formed upon a single substrate, e.g., a silicon substrate, which tends to make it easier to provide aligned axes.

SUMMARY OF THE INVENTION

The present invention provides a single integrated magnetic field sensing element and associated magnetic field sensor that can generate a signal or signals that is/are indicative of characteristics of a magnetic field in three dimensions. In some embodiments, the integrated magnetic field sensing element is formed upon a single substrate, e.g., a silicon substrate, which tends to make it easier to provide aligned axes.

In accordance with one aspect of the present invention, a magnetic field sensor includes a semiconductor substrate having first and second parallel major surfaces. The magnetic field sensor includes a plurality of vertical Hall elements arranged as a circular vertical Hall (CVH) structure. Each one of the plurality of vertical Hall elements is arranged upon a common circular implant region in the first major surface of the semiconductor substrate. The plurality of vertical Hall elements is configured to generate a respective plurality of x-y output signals responsive to a magnetic field having a direction component in an x-y plane parallel to the first major surface of the semiconductor substrate, the x-y plane having an x-direction and a y-direction orthogonal to the x-direction. The magnetic field sensor also includes a planar Hall element disposed upon the semiconductor substrate. The planar Hall element is configured to generate a z output signal responsive to a magnetic field having a direction component in a z direction orthogonal to the x-y plane. The magnetic field sensor also includes a processing circuit disposed upon the semiconductor substrate, coupled to receive a signal representative of the plurality of x-y output signals, coupled to receive a signal representative of the z output signal, configured to generate one or more of an x-y angle signal representative of an angle of the direction component in the x-y-plane, or an x-y magnitude signal representative of a magnitude of the direction component in the x-y plane, and configured to generate a z magnitude signal representative of a magnitude of the direction component in the z direction.

In some embodiments, the x-y angle signal, the x-y magnitude signal, and the z-magnitude signal can be combined to generate a three-dimensional signal representative of a three-dimensional pointing direction of the magnetic field and/or a magnitude of the magnetic field along the three-dimensional pointing direction.

In accordance with another aspect of the present invention, a magnetic field sensor includes a semiconductor substrate having first and second parallel major surfaces parallel to an x-y plane. The magnetic field sensor also includes a plurality of planar Hall elements arranged as a circular planar Hall (CPH) structure. Each one of the plurality of planar Hall elements is arranged upon a common circular implant region in the first major surface of the semiconductor substrate. The plurality of planar Hall elements is configured to generate a plurality of z output signals responsive to a magnetic field having a direction component in a z direction orthogonal to the x-y plane.

In accordance with another aspect of the present invention, a method of fabricating a magnetic field sensing element arrangement includes forming a common circular implant region in a first major surface of a semiconductor substrate having the first and a second major parallel surface both parallel to an x-y plane. The method also includes forming, over the common circular implant region, a plurality of planar Hall elements arranged as a circular planar Hall (CPH) structure. The plurality of planar Hall elements is configured to generate a plurality of z output signals responsive to a magnetic field having a direction component in a z direction orthogonal to the x-y plane.

BRIEF DESCRIPTION OF THE DRAWINGS

The foregoing features of the invention, as well as the invention itself may be more fully understood from the following detailed description of the drawings, in which.

DETAILED DESCRIPTION OF THE INVENTION

Before describing the present invention, some introductory concepts and terminology are explained.

As used herein, the term "magnetic field sensing element" is used to describe a variety of electronic elements that can sense a magnetic field. The magnetic field sensing elements can be, but are not limited to, Hall effect elements, magnetoresistance elements, or magnetotransistors. As is known, there are different types of Hall effect elements, for example, a planar Hall element, a vertical Hall element, and a circular Hall element. As is also known, there are different types of magnetoresistance elements, for example, a giant magnetoresistance (GMR) element, an anisotropic magnetoresistance element (AMR), a tunneling magnetoresistance (TMR) element, an Indium antimonide (InSb) sensor, and a magnetic tunnel junction (MTJ).

A so-called "circular vertical Hall" (CVH) sensing element, is known and described in PCT Patent Application No. PCT/EP2008056517, entitled "Magnetic Field Sensor for Measuring Direction of a Magnetic Field in a Plane," filed May 28, 2008, and published in the English language as PCT Publication No. WO 2008/145662, which application and publication thereof are incorporated by reference herein in their entirety. The CVH sensing element is a circular arrangement of vertical Hall elements (i.e., vertical Hall element contacts) arranged over a common circular implant region in a substrate. The CVH sensing element can be used to sense a direction (i.e., an angle), and optionally a magnitude, of a component of a magnetic field in a plane of the substrate.

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while magnetoresistance elements and vertical Hall elements (including circular vertical Hall (CVH) sensing elements) tend to have axes of sensitivity parallel to a substrate.

Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet, and a magnetic field sensor that senses a magnetic field density of a magnetic field.

Figure 1:
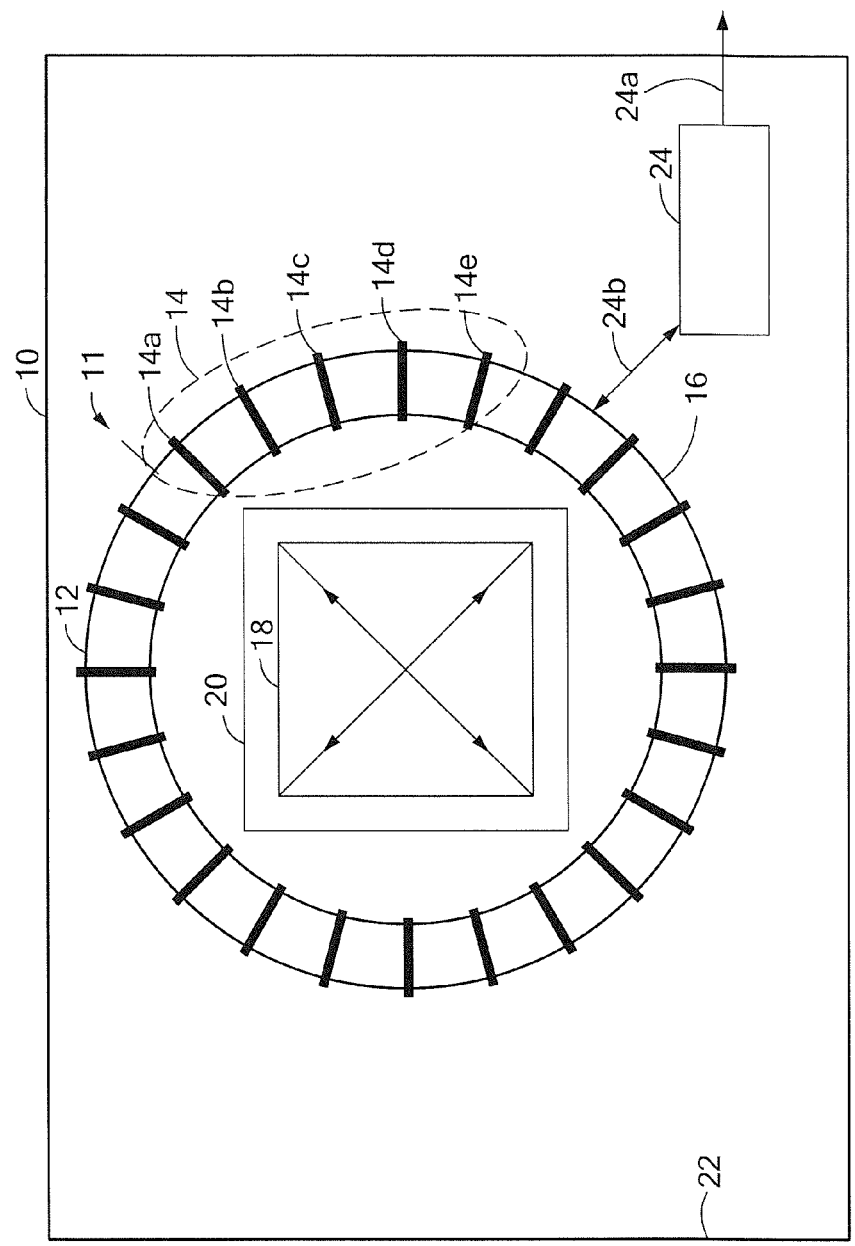
FIG. 1 is a pictorial showing a magnetic field sensor having a magnetic field sensing element arrangement with a circular vertical Hall (CVH) sensing element and a planar Hall element disposed over separate implant regions in a common substrate.

Referring to FIG. 1, a magnetic field sensor 10 can include a magnetic field sensing element arrangement 11. The magnetic field sensing element arrangement 11 includes a circular vertical Hall (CVH) sensing element 12 disposed over a common implant region 16, which is disposed upon a substrate 22. The CVH sensing element 12 includes a plurality of vertical Hall elements, of which a vertical Hall element 14 is but one example. The vertical Hall element 14, like other vertical Hall elements in the CVH sensing element 12, includes a plurality of vertical Hall element contacts, of which vertical Hall element contacts 14a, 14b, 14c, 14d, 14e are examples. While the vertical Hall element 14 is shown having five vertical Hall element contacts 14a, 14b, 14c, 14d, 14e, in other embodiments, a CVH sensing element can have vertical Hall elements with more than five or fewer than five vertical Hall element contacts, for example, four vertical Hall element contacts or six vertical Hall element contacts.

The magnetic field sensing element arrangement 11 can also include a planar Hall element 18 disposed upon the substrate 22, for example in the center or near the center of the CVH sensing element 12. However, other placements of the planar Hall element 18 upon the substrate 22 are also possible. The planar Hall element 18 is disposed over a separate implant region 20.

The CVH sensing element 12 in conjunction with electronics 24, described more fully below, can provide an output signal 24a representative of one or more two dimensional aspects of a magnetic field. The one or more aspects can include, for example, a) an angle of a direction of a component of a magnetic field experienced by the CVH sensing element 12 in a plane of the CVH sensing element 12, and b) a magnitude of the magnetic field in the plane of the CVH sensing element 12.

In contrast, the planar Hall element 18 in conjunction with the electronics 24 can provide the output signal 24a representative of a magnitude of a component of the magnetic field in a direction perpendicular to a plane of the planar Hall element 18.

With the above information, the magnetic field sensing element arrangement 11 in conjunction with the electronics 24 can provide sufficient information to resolve some three-dimensional characteristics of the magnetic field, for example, a) a three-dimensional pointing direction of the magnetic field experienced by the magnetic field sensing element arrangement 10, and b) a magnitude of the magnetic field along the three-dimensional pointing direction. In some embodiments, the resolution of the three-dimensional characteristics can be provided by another processor (not shown) coupled to receive the signal 24a. However, in some embodiments, the electronics 24 can provide the output signal 24a representative of the three-dimensional pointing direction of the magnetic field and also the magnitude of the magnetic field in the three-dimensional pointing direction.

Figure 2A:
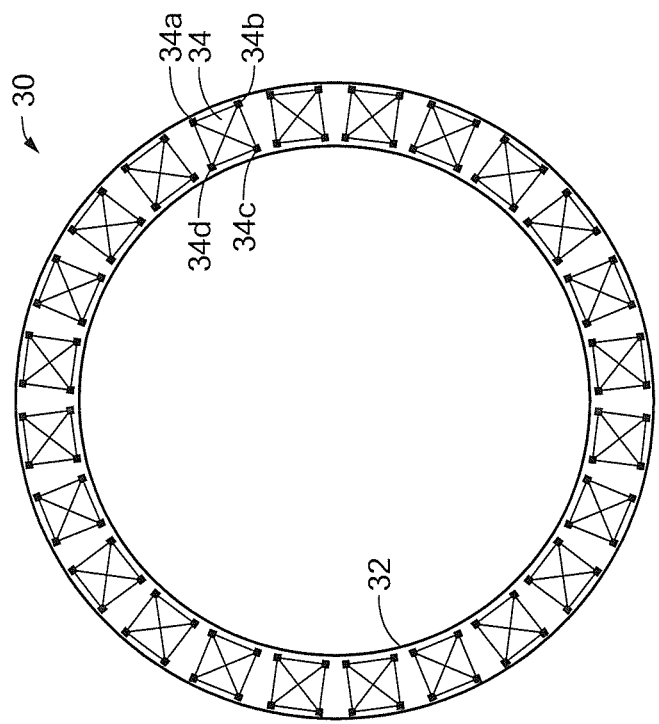
FIG. 2A is a pictorial showing a circular planar Hall (CPH) sensing element having a plurality of planar Hall elements, each planar Hall element having a plurality of planar Hall element contacts.
Figure 2:
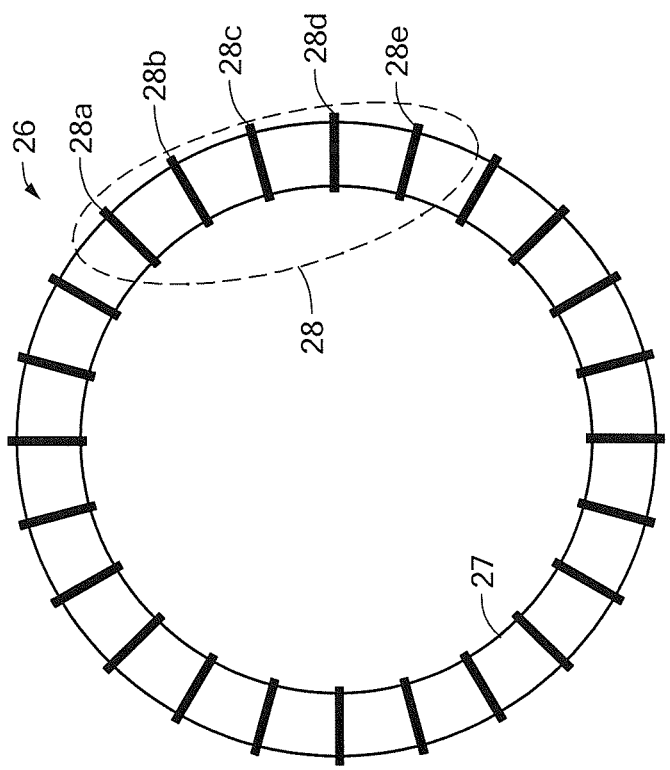
FIG. 2 is a pictorial showing a CVH sensing element having a plurality of vertical Hall elements, each vertical Hall element having a plurality of vertical Hall element contacts.

Referring now to FIG. 2, a CVH sensing element 26 having a plurality of vertical Hall elements, of which a vertical Hall element 28 is but one example, can be the same as or similar to the CVH sensing element 12 of FIG. 1. The CVH sensing element 26 can include a common implant region 27 in a substrate over which the plurality of vertical Hall elements, each having a plurality of vertical Hall element contacts, are disposed. Each vertical Hall element, for example, a vertical Hall element 28, can include a plurality of vertical Hall element contacts, for example, five contacts, 28a, 28b, 28c, 28d, 28e.

Referring now to FIG. 2A, a circular planar Hall (CPH) sensing element 30 can include a plurality of planar Hall elements, of which a planar Hall elements 34 is but one example. The planar Hall elements can be disposed over a common implant region 32 in a substrate. Each planar Hall element, for example, the planar Hall element 34, can include a plurality of planar Hall element contacts, for example four contacts, 34a, 34b, 34c, 34d.

Figure 2B:
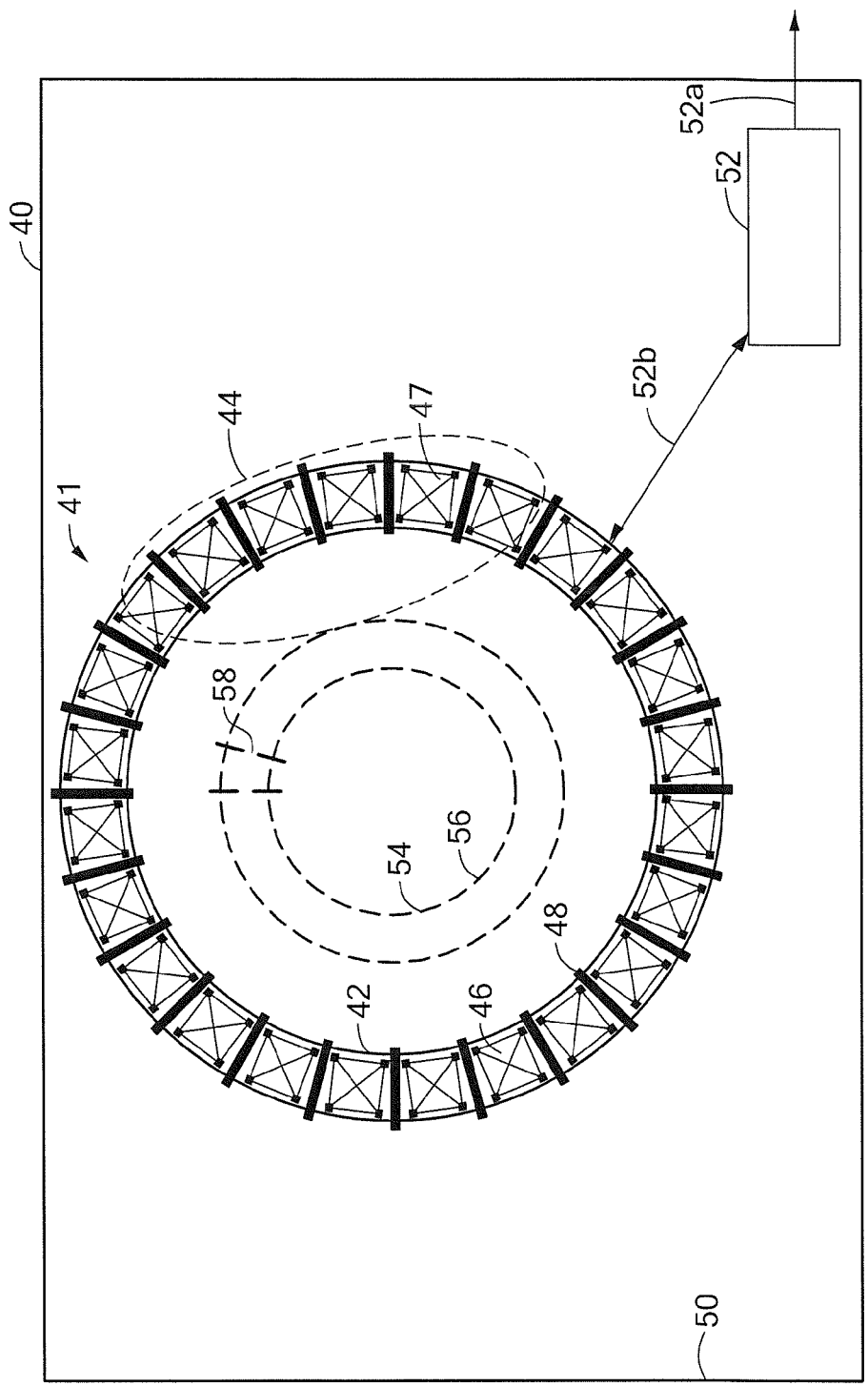
FIG. 2B is a pictorial showing a magnetic field sensing element arrangement having a CVH sensing element and having a CPH sensing element all disposed over a common implant region in a common substrate.

Referring now to FIG. 2B, a magnetic field sensor 40 can include a magnetic field sensing element arrangement 41. The magnetic field sensing element arrangement 41 can include a CVH sensing element 48, which can be the same as or similar to the CVH sensing element 26 of FIG. 2, and also a CPH sensing element 46, which can be the same as or similar to the CPH sensing elements 30 of FIG. 2A. The CVH sensing element 48, which includes a plurality of vertical Hall elements, of which a vertical Hall element 44 is but one example, is disposed over a common implant region 42 upon a substrate 50. Also, the CPH sensing element 46, which includes a plurality of planar Hall elements, of which a planar Hall element 47 is but one example, is also disposed over the common implant region 42 upon the substrate 50. Each one of the planar Hall elements of the CPH sensing element 46 can be disposed between contacts of the CVH sensing element.

It will be appreciated that, like the magnetic field sensor 10 of FIG. 1, the magnetic field sensor 40 can include electronics 52, described more fully below, that can provide an output signal 52a representative of one or more two and/or three-dimensional characteristics of a magnetic field experienced by the magnetic field sensor 40. For example, the output signal 52a can provide information representative of one or more of a) an angle of a direction of a component of a magnetic field experienced by the magnetic field sensing element arrangement 41 in a plane of the CVH sensing element 48, b) a magnitude of the component of the magnetic field in the plane of the CVH sensing element 48, c) a magnitude of a component of the magnetic field in a direction perpendicular to a plane of the CPH sensing element 46, d) a three-dimensional pointing direction of the magnetic field experienced by the magnetic field sensing element arrangement 41, and e) a magnitude of the magnetic field along the three-dimensional pointing direction.

In some alternate embodiments, the CVH sensing element 48 and the CPH sensing element 46 are disposed over different implant regions. In some alternate embodiments, there are fewer planar Hall elements such that a planar Hall element is not disposed between every pair of vertical Hall element contacts.

Shown optionally, by way of phantom lines, as described above, instead of the CVH sensing element 48, the sensing element arrangement 41 can have a CVH sensing element 54 disposed over a separate common implant region 56, separate from the common implant region 42 over which the CPH sensing element 46 is disposed. In the CVH sensing element 54, only two vertical Hall element contacts, e.g., 58, are shown for clarity.

While the optional CVH sensing element 54 is shown to have a smaller diameter disposed over a smaller diameter common implant region than the CPH sensing element 46, in other embodiments, an optional CVH sensing element can have a larger diameter and be disposed over a larger diameter common implant region than the CPH sensing element 46. In some embodiments, the optional CVH sensing element 54 is disposed on an opposite side of the substrate 50 from the CPH sensing element 46.

Figure 3:
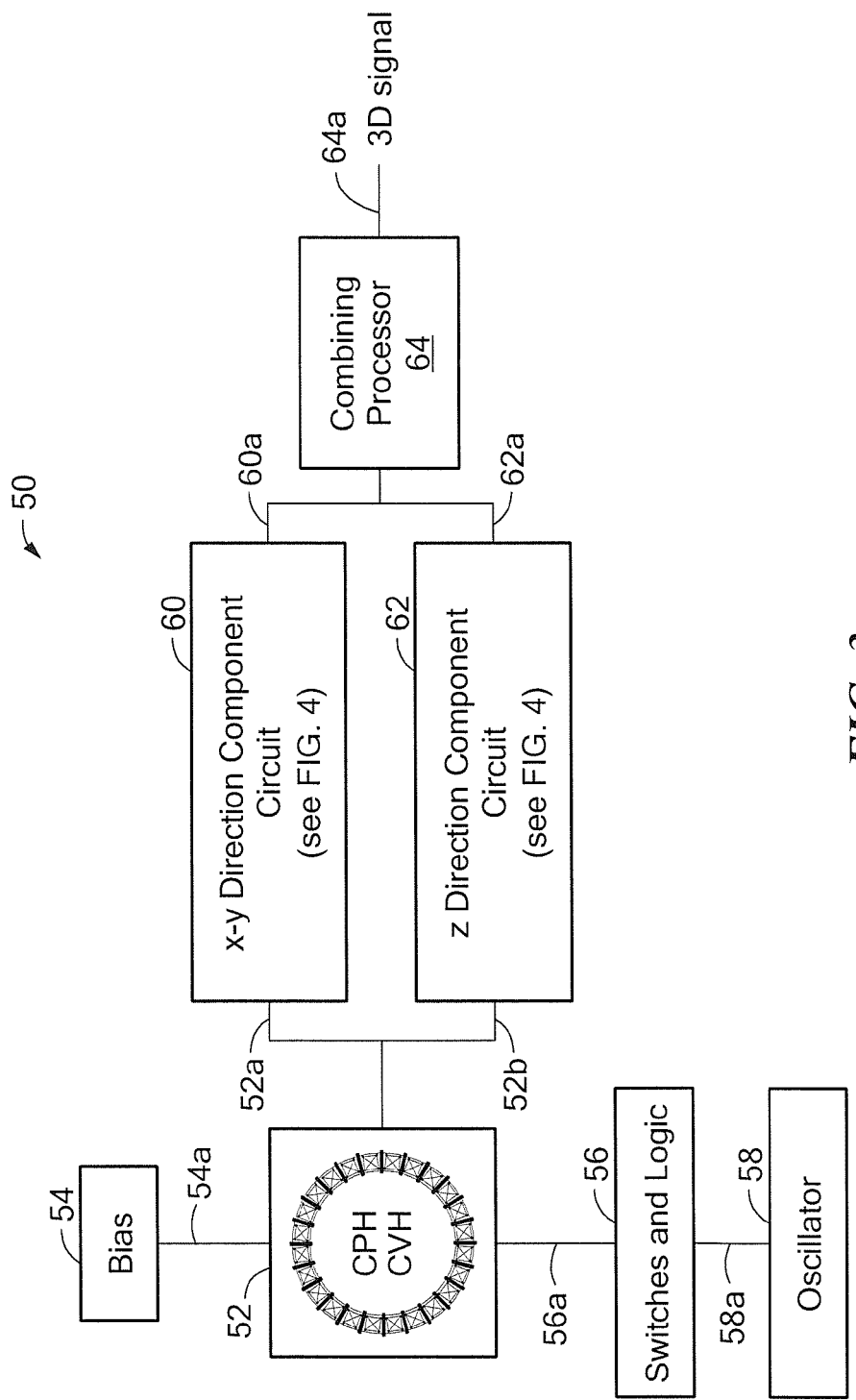
FIG. 3 is a block diagram showing a magnetic field sensor having a magnetic field sensing element arrangement with the CVH sensing element and with a CPH sensing element in a combined arrangement, having an x-y direction component circuit, having a z direction component circuit, and having a combining circuit.

Referring now to FIG. 3, a magnetic field sensor 50 can include a magnetic field sensing element arrangement 52, which can include a combination of a CVH sensing element an a CPH sensing element like the magnetic field sensing element arrangement 41 of FIG. 2B. In other embodiments, the magnetic field sensing element arrangement 52 can be like the magnetic field sensing element arrangement 11 of FIG. 1.

An oscillator 58 is configured to generate a clock signal 58a. Switches and logic 56 are coupled to provide control signals 56a to the magnetic field sensing element arrangement 52. The switching and control of a CVH sensing element are described more fully in the above-mentioned PCT Patent Application No. PCT/EP2008056517. Switching and control of a CPH sensing element is similar to that of a CVH sensing element. Both are described more fully below in conjunction with FIG. 7.

A bias circuit 54 is configured to provide one or more bias signals 54a to the magnetic field sensing element arrangement 52. In some embodiments, the one or more bias signals 54a are current signals.

The magnetic field sensing element arrangement 52 is configured to generate an output signal 52a representative of an angle and a magnitude of a component of the magnetic field experienced by the magnetic field sensing element arrangement 52 in a plane (an x-y plane) of the magnetic field sensing element arrangement 52. The magnetic field sensing element arrangement 52 is also configured to generate an output signal 52b representative of a magnitude of a component of the magnetic field experienced by the magnetic field sensing element arrangement 52 in a direction perpendicular to the plane of magnetic field sensing element arrangement 52.

An x-y direction component circuit 60 is coupled to receive the signal 52a and configured to generate a signal 60 a representative of the angle of the component of the magnetic field experienced by the magnetic field sensing element arrangement 52 in the plane of the magnetic field sensing element arrangement 52, and can be representative of the magnitude of the component of the magnetic field in the plane of the magnetic field sensing element arrangement 52. A z direction component circuit 62 is coupled to receive the signal 52b and configured to generate a signal 62a representative of the magnitude of the component of the magnetic field experienced by the magnetic field sensing element arrangement 52 in the direction perpendicular to the plane of the sensing element and arrangement 52.

A combining processor 64 is coupled to receive the signals 60a, 62a, and configured to generate an output signal 64a, which can be signal representative of all of the above directional characteristics. In some embodiments, the output signal can also or instead be representative of a three-dimensional pointing direction of the magnetic field and/or a magnitude of the magnetic field along the three-dimensional pointing direction.

Operation of the magnetic field sensor 50 is more fully described below in conjunction with FIG. 4.

Figure 4:
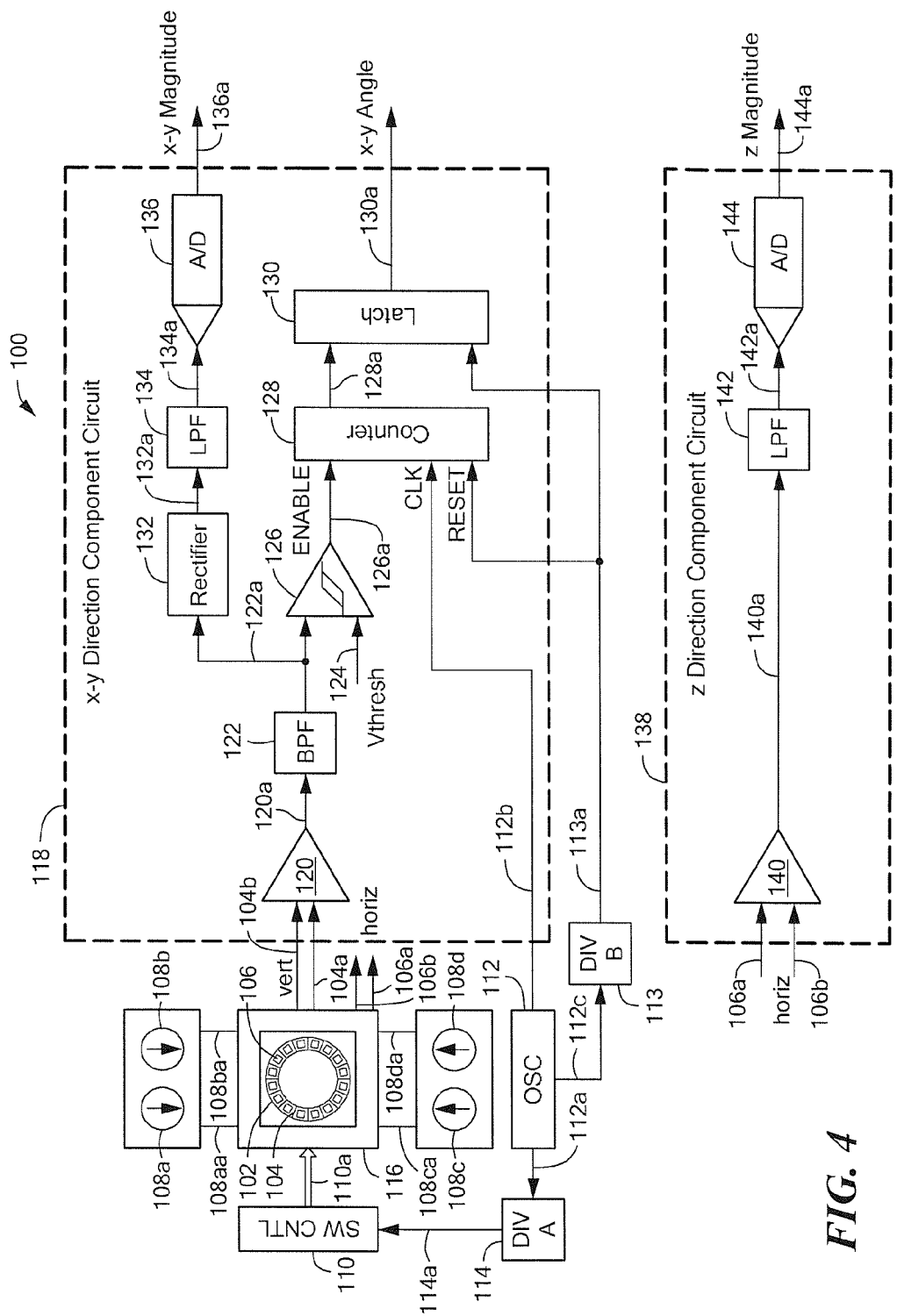
FIG. 4 is a block diagram showing further details of the magnetic field sensor of FIG. 3.

Referring now to FIG. 4, a magnetic field sensor 100 includes a magnetic field sensing element arrangement 102 having a CVH sensing element 104 with a plurality of vertical Hall elements and a CPH sensing element 106 with a plurality of planar Hall elements, like the magnetic field sensing element arrangement 41 of FIG. 2B. In other embodiments, the magnetic field sensing element arrangement 102 can be like the magnetic field sensing element arrangement 11 of FIG. 1.

Current sources 108a, 108b, 108c, 108d can provide bias signals in the form of current signals 108aa, 108ba, 108ca, 108da to the magnetic field sensing element arrangement 102.

An oscillator 112 can generate a clock signal 112a. A divider 114 can be coupled to receive the clock signal 112a and configured to generate a divided clock signal 114a. A switch control circuit 110 can be coupled to receive the divided clock circuit 114a and configured to generate control signals 110a. A switching circuit 116 is coupled to receive the control signals 110a and configured to operate the magnetic field sensing element arrangement 102 in ways more fully described below.

Operation of the CVH sensing element part 104 of the magnetic field sensing element arrangement 102 is more fully described in the above-described PCT Publication No. WO 2008/145662.

The magnetic field sensing element arrangement 102, and, in particular, the CVH sensing element 104, is configured to generate a differential signal 104a, 104b, which includes a plurality of so-called "x-y output signals." The magnetic field sensing element arrangement 102, and, in particular, the CPH sensing element 106, is also configured to generate a differential signal 106a, 106b, which includes a plurality of so-called "z output signals."

The magnetic field sensor 100 can include an x-y direction component circuit 118, which can be the same as or similar to the x-y direction component circuit 60 of FIG. 3. The x-y direction component circuit 118 can include an amplifier 120 coupled to receive the differential signal 104a, 104b and configured to generate an amplified signal 120a (also referred to herein as a first intermediate signal). A bandpass filter 122 is coupled to receive the amplified signal 120a and configured to generate a filtered signal 122a. A comparator 126, with or without hysteresis, is coupled to receive the filtered signal 122a. The comparator 126 is also coupled to receive a threshold signal 124. The comparator 126 is configured to generate a thresholded signal 126a responsive to a comparison between the filtered signal 122a and a threshold signal 124.

The x-y direction component circuit 118 can also include a counter 128 coupled to receive the thresholded signal 126a at an enable input.

The oscillator 112 is also configured to generate clock signals 112b and 112c. A divider 113 is coupled to receive the clock signal 112c and configured to generate another divided clock signal 113a.

The counter 128 is coupled to receive the clock signal 112b at a clock input and coupled to receive the divided clock signal 113a at a reset input.

In operation, the counter 128 is configured to generate a count signal 128a, which is a multi-bit digital signal representative of a phase difference between the thresholded signal 126a and the divided clock signal 113a. Thus, the count signal 128a is representative of an angle of a direction of a component of the magnetic field experienced by the CVH sensing element 104 in a plane of the CVH sensing element 104, which is also referred to herein as an x-y plane.

The x-y direction component circuit 118 can also include a latch 130 coupled to receive the count signal 128a and configured to generate a latched signal 130a, which, like the count signal 128a, is representative of the angle of the direction of the component of the magnetic field experienced by the CVH sensing element 104 in the x-y plane of the CVH sensing element 104.

The x-y direction component circuit 118 can also include an amplitude detection circuit. The amplitude detection circuit can include a rectifier 132 coupled to receive the filtered signal 122a and configured to generate a rectified signal 132a. The amplitude detection circuit can also include a low pass filter 134 coupled to receive the rectified signal 132a and configured to generate a low pass filtered signal 134a. An analog-to-digital converter 136 can be coupled to receive the low pass filtered signal 134a and configured to generate a signal 136a, which is representative of a magnitude the component of the magnetic field experienced by the CVH sensing element 104 in the x-y plane. Other circuit topologies can also be used to detect amplitude.

The magnetic field sensor 100 can also include a z direction component circuit 138 having an amplifier 140 coupled to receive the differential signal 106a, 106b. The amplifier 140 is configured to generate an amplified signal 140a (also referred to herein as a second intermediate signal). A low pass filter 142 is coupled to receive the amplified signal 140a and configured to generate a filtered signal 142a. An analog-to-digital converter 144 is coupled to receive the filtered signal 142a and configured to generate a z magnitude signal 144a, which is representative of a magnitude of a component of the magnetic field experienced by the CPH sensing element 106 in a direction perpendicular to the x-y plane. Other circuit topologies can also be used to detect the z-magnitude.

The signals 136a, 130a, 144a can be provided to a combining processor, for example, the combining processor 64 of FIG. 3. In some embodiments, the combining processor is configured to format one or more of the signals 130a, 136a, 144a into a standard format for communication to circuits outside of the magnetic field sensor. The format can be one of a variety of formats, including, but not limited to, a SENT format, an I2C format, or a pulse width modulated (PWM) format. In other embodiments, the combining processor is further configured to process the signals 130a, 136a, 144a to generate one or more of a signal representative of a pointing direction of the magnetic field in three dimensions, for example, an angle relative to the x-y plane, or a signal representative of a magnitude of the magnetic field signal along the three-dimensional pointing direction. These signals can also be put into one of the above standard formats for communication with the above-described signals or in place of the above-described signals.

Figure 5:
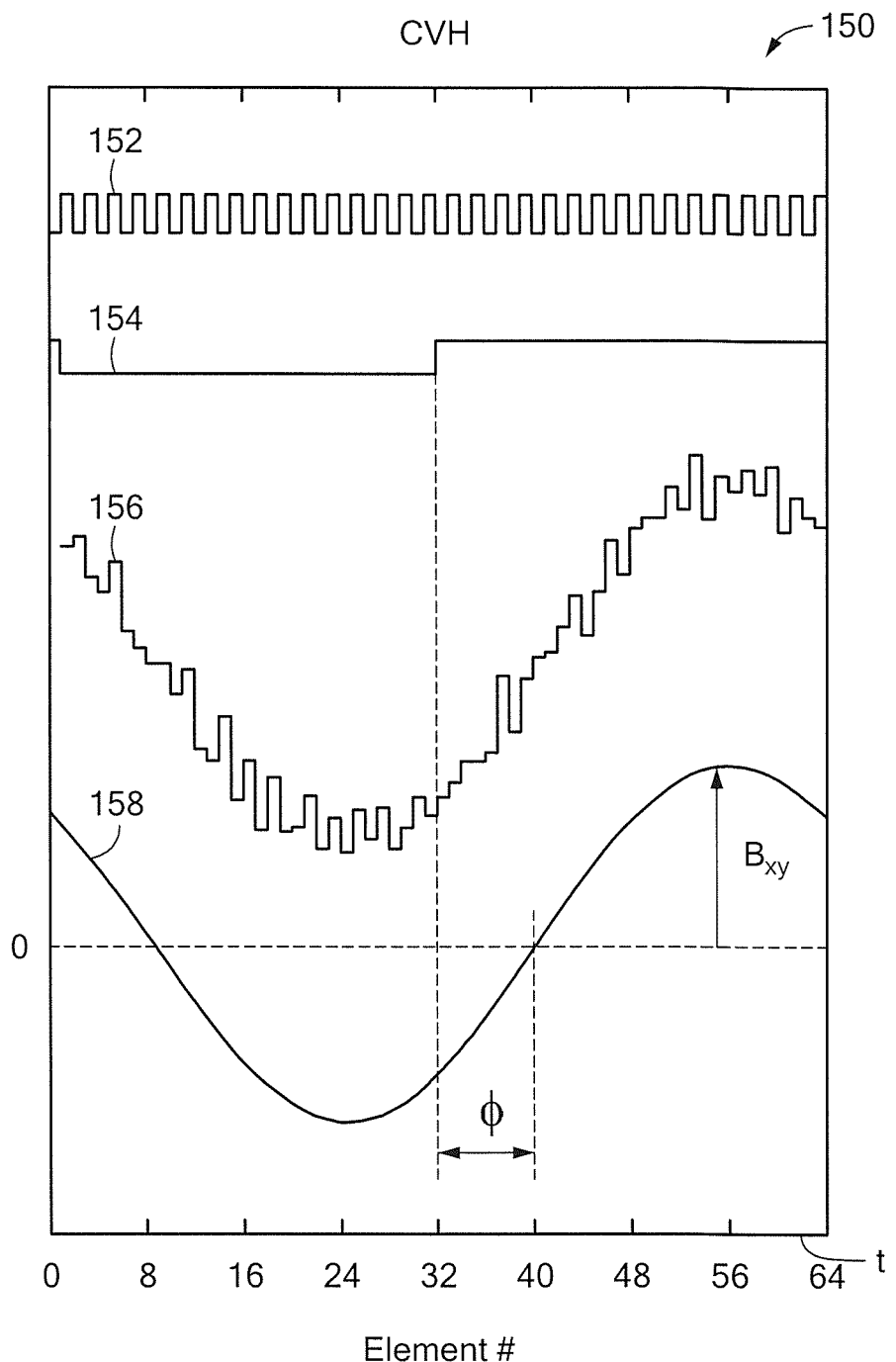
FIG. 5 is a graph showing four signals within the magnetic field sensor of FIG. 4 and associated with the CVH sensing element.

Referring now to FIG. 5, a graph 150 has a horizontal axis with units representative of a vertical Hall element position around the CVH sensing element 104 of FIG. 4. Vertical Hall element position is discussed more fully below in conjunction with FIG. 7. As will be understood from discussion below in conjunction with FIG. 7, in an exemplary embodiment there can be sixty-four vertical Hall element contacts in the CVH sensing element 104 and a corresponding sixty-four vertical Hall elements in the CVH sensing element 104.

The graph 150 also includes a vertical axis having units of volts in four different ranges corresponding to four different signals 152, 154, 156, 158.

The signal 152 is representative of the clock signal 112b of FIG. 4. The signal 154 is representative of the divided clock signal 113a of FIG. 4. The signal 156 is representative of the amplified signal 120a of FIG. 4. The signal 158 is representative of the filtered signal 122a of FIG. 4.

It should be understood that the signal 154 is a fixed reference signal that does not change phase in relation to a direction of a magnetic field. However, the signals 156 and 158 do change phase in relation to the direction of the magnetic field in the plane of a corresponding CVH sensing element. The phase difference between that of the signal 154 and that of the signals 156, 158 is representative of an angle of the magnetic field in a plane of the CVH sensing element.

From the signal 158, it can be seen that different ones of the vertical Hall elements within the CVH sensing element 104 provide signals with different amplitudes relative to zero when in the presence of a magnetic field. A maximum negative signal is achieved at vertical Hall element position number 24 and a maximum positive signal is achieved at vertical Hall element position number 56. A phase of the signal 158, i.e., a sensing element position of the maxima and minima, is related to the angle of the direction of a component of the magnetic field experienced by the CVH sensing element 104 in the plane of the CVH sensing element 104 (FIG. 4). Thus, for other angles of the magnetic field, the phase will be different, and the maxima and minima (and also the zero crossings) will be at different vertical Hall element positions.

With regard to the signal 156, the irregular up-and-down excursions of the signal 156 are representative of DC offset signals that vary among the vertical Hall elements of the CVH sensing element 104. The offset voltages are undesirable.

A magnitude $B_{xy}$ of the signal 158 is representative of the magnitude of the component of the magnetic field experienced by the CVH sensing element 104 of FIG. 4 in the plane of the CVH sensing element 104.

Figure 6:
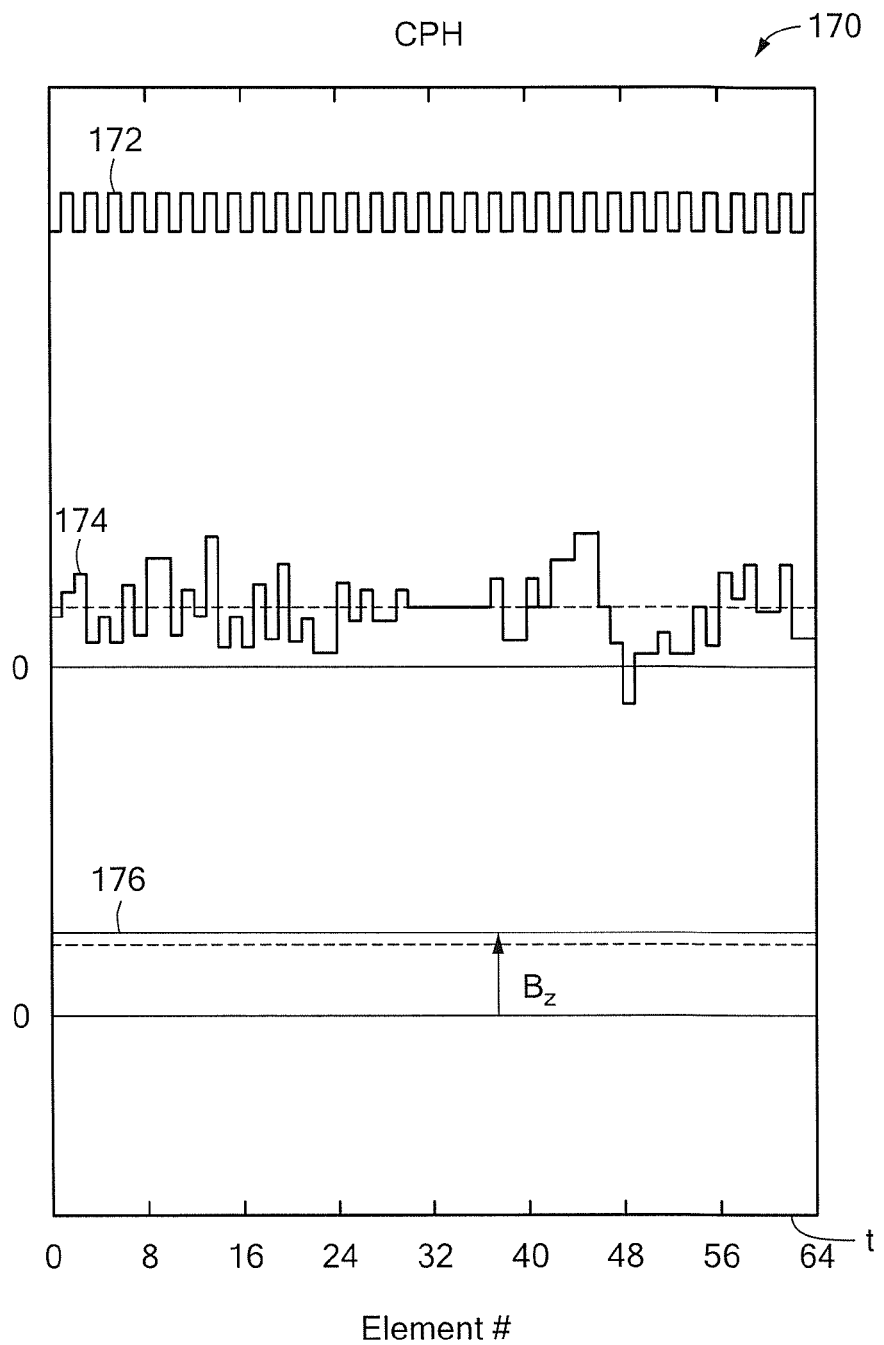
FIG. 6 is a graph showing another three signals within the magnetic field sensor of FIG. 4 and associated with the CPH sensing element.

Referring now to FIG. 6, graph 170 has a horizontal axis with units representative of a planar Hall element position around the CPH sensing element 106 of FIG. 4. As will be understood from discussion below in conjunction with FIG. 7, in an exemplary embodiment there can be sixty-four planar Hall elements in the CPH sensing element 106 and two hundred fifty six planar Hall element contacts in the CPH sensing element 106.

The graph 170 also includes a vertical axis having units of volts in three different ranges corresponding to three different signals 172, 174, 176.

The signal 172, like the signal 152 of FIG. 5, is representative of the clock signal 112b of FIG. 4. The signal 174 is representative of the amplified signal 140a of FIG. 4. The signal 176 is representative of the filtered signal 142a of FIG. 4.

A magnitude 13, of the signal 176 is representative of a magnitude of a component of the magnetic field experienced by the CPH sensing element 106 in a direction perpendicular to the plane of the CPH sensing element 106.

Figure 7:
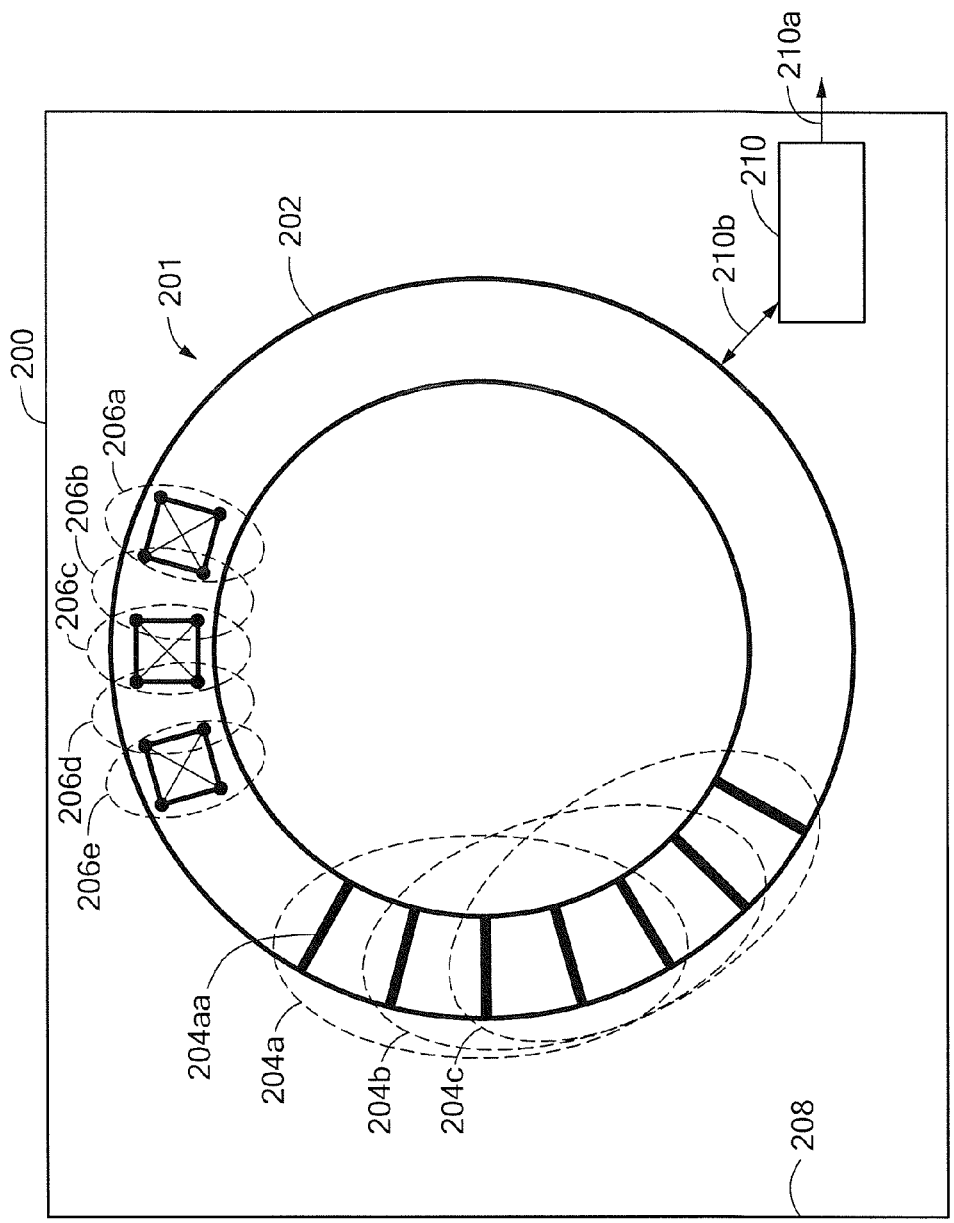
FIG. 7 is a pictorial showing magnetic field sensor having a magnetic field sensing element arrangement with a CVH sensing element and a CPH sensing element.

Referring now to FIG. 7, a magnetic field sensor 200 includes a magnetic field sensing element arrangement 201. The magnetic field sensing element arrangement 201 includes a circular implant region 202 in a surface of a substrate 208. A plurality of vertical Hall elements, of which vertical Hall elements 204a, 204b, 204c are examples, is disposed upon the circular implant region 202. Each vertical Hall element has a plurality of Hall element contacts (e.g., four or five contacts), of which a vertical Hall element contact 204aa is but one example.

A particular vertical Hall element (e.g., 204a) within the CVH sensing, which, for example, can have five adjacent contacts, can share some, for example, four, of the five contacts with a next vertical Hall element (e.g., 204b). Thus, a next vertical Hall element 204b can be shifted by one contact from a prior vertical Hall element. For such shifts by one contact, it will be understood that the number of vertical Hall elements is equal to the number of vertical Hall element contacts, e.g., sixty-four. However, it will also be understood that a next vertical Hall element can be shifted by more than one contact from the prior vertical Hall element, in which case, there are fewer vertical Hall elements than there are vertical Hall element contacts in the CVH sensing element.

In an exemplary CVH sensing element, there are sixty-four vertical Hall elements and sixty-four vertical Hall element contacts. However, a CVH can have more than or fewer than sixty-four vertical Hall elements and more than or fewer than sixty-four vertical Hall element contacts.

The magnetic field sensing element arrangement 201, like the magnetic field sensing element arrangement 41 of FIG. 2B, can also include a plurality of planar Hall elements, for example, planar Hall elements 206a, 206b, 206c, 206d, 206e.

Each planar Hall element can have, for example, four contacts, which are represented by dots. In some embodiments contacts of planar Hall elements are essentially shared. For example, in one embodiment a first planar Hall element 206a has four contacts. A next planar Hall element 206b shares two of the contacts of the planar Hall element 206a. A next planar Hall element 206c shares two of the contacts of the planar Hall element 206b, and so on.

In other embodiments, contacts of adjacent planar Hall elements are not shared. For example, a first planar Hall element 206a can share no contacts with a next planar Hall element 206c.

In some embodiments, each vertical Hall element (e.g., five vertical Hall element contacts) is chopped. Chopping will be understood to be a switching arrangement that reconfigures the current drive signals to the contacts of a vertical Hall element and reconfigures the output signal contacts of a vertical Hall element, most often in four configurations, one at a time, to provide an output signal from the vertical Hall element sequentially representative of the four configurations. Chopping tends to result in a reduction of the effect of offset voltages of the vertical Hall elements discussed above in conjunction with the signal 156 of FIG. 5.

Similarly, in some embodiments, each planar Hall element (e.g., four planar Hall element contacts) is chopped to achieve the same benefit. However, in other embodiments no chopping is used, in which case, only one configuration of drive and output contacts is used for each vertical or planar Hall element.

While sixty-four vertical Hall elements and sixty-four planar Hall elements are described in CVH and CPH sensing elements above, it will be understood that there can be more than or fewer than sixty-four or either type of Hall elements in the magnetic field sensing element arrangements described above, including embodiments that have unequal numbers of vertical Hall elements All references cited herein are hereby incorporated herein by reference in their entirety. Having described preferred embodiments, which serve to illustrate various concepts, structures and techniques, which are the subject of this patent, it will now become apparent to those of ordinary skill in the art that other embodiments incorporating these concepts, structures and techniques may be used. Accordingly, it is submitted that that scope of the patent should not be limited to the described embodiments but rather should be limited only by the spirit and scope of the following claims.

What is claimed is:

1. A magnetic field sensor, comprising:
   a semiconductor substrate having first and second parallel major surfaces;
   a plurality of vertical Hall elements arranged as a circular vertical Hall (CVH) structure, wherein each one of the plurality of vertical Hall elements is arranged upon a common circular implant region in the first major surface of the semiconductor substrate, wherein the plurality of vertical Hall elements is configured to generate a respective plurality of x-y output signals responsive to a magnetic field having a direction component in an x-y plane parallel to the first major surface of the semiconductor substrate, the x-y plane having an x-direction and a y-direction orthogonal to the x-direction;
   a plurality of planar Hall elements disposed upon the semiconductor substrate, wherein the plurality of planar Hall elements is arranged in a circular planar Hall (CPH) structure, wherein each one of the plurality of planar Hall elements is arranged upon the common circular implant region of the CVH structure or upon a separate common implant region of the CPH structure, wherein the plurality of planar Hall elements is configured to generate a plurality of z output signals responsive to a magnetic field having a direction component in a z direction orthogonal to the x-y plane; and
   a processing circuit disposed upon the semiconductor substrate, coupled to receive a signal representative of the plurality of x-y output signals, coupled to receive a signal representative of the plurality of z output signals, configured to generate one or more of an x-y angle signal representative of an angle of the direction component in the x-y-plane, or an x-y magnitude signal representative of a magnitude of the direction component in the x-y plane, and configured to generate a z magnitude signal representative of a magnitude of the direction component in the z direction.

2. The magnetic field sensor of claim 1, wherein the common circular implant region comprises n-type doping material and wherein the substrate is comprised of p-type material.

3. The magnetic field sensor of claim 2, wherein the semiconductor substrate comprises a silicon substrate.

4. The magnetic field sensor of claim 1, wherein each one of the plurality of planar Hall elements comprises a respective group of planar Hall element contacts, wherein the processing circuit is operable to process the plurality of planar Hall elements using a plurality of groups of the planar Hall element contacts to generate the signal representative of the plurality of z output signals.

5. The magnetic field sensor of claim 4, wherein the processing circuit is further operable to process each group of planar Hall element contacts in a multiplexed arrangement, wherein different ones of the planar Hall element contacts of each one of the plurality of planar Hall elements provide different ones of the plurality of z output signals at different times.

6. The magnetic field sensor of claim 4, wherein each one of the plurality of vertical Hall elements comprises a respective group of vertical Hall element contacts, wherein the processing circuit is operable to process the plurality of vertical Hall elements using a plurality of groups of vertical Hall element contacts to generate the signal representative of the plurality of x-y output signals.

7. The magnetic field sensor of claim 6, wherein the processing circuit is operable to process each group of vertical Hall element contacts in a multiplexed arrangement, wherein different ones of the vertical Hall element contacts of each one of the plurality of vertical Hall elements provide different ones of the plurality of x-y output signals at different times.

8. The magnetic field sensor of claim 6, wherein the processing circuit comprises a z direction component processor coupled to receive the signal representative of the plurality of z output signals and configured to generate a first intermediate signal responsive to the direction component of the magnetic field in the z direction.

9. The magnetic field sensor of claim 8, wherein the first intermediate signal comprises a DC signal component having a DC signal value responsive to a magnitude of the direction component of the magnetic field in the z direction, wherein the processing circuit is operable to generate the z magnitude signal indicative of the magnitude of the direction component of the magnetic field in the z direction responsive to the DC signal value.

10. The magnetic field sensor of claim 8, wherein the processing circuit further comprises an x-y direction component processor coupled to receive the signal representative of the plurality of x-y output signals and configured to generate a second intermediate signal responsive to the direction component of the magnetic field in the x-y plane.

11. The magnetic field sensor of claim 10, wherein the second intermediate signal comprises an AC signal component having a phase responsive to an angle of the direction component of the magnetic field in the x-y plane and having a magnitude responsive to a magnitude of the direction component of the magnetic field in the x-y plane, wherein the processing circuit is operable to generate the x-y angle signal indicative of the angle of the direction component of the magnetic field in the x-y plane in response to the phase of the AC signal component.

12. The magnetic field sensor of claim 11, wherein the processing circuit is further operable to generate the x-y magnitude signal indicative of the magnitude of the direction component of the magnetic field in the x-y plane in response to the magnitude of the AC signal component.

13. The magnetic field sensor of claim 10, wherein the z direction component processor comprises a low pass filter coupled to receive a signal representative of the first intermediate signal.

14. The magnetic field sensor of claim 10, wherein the x-y direction component processor comprises:
   a bandpass filter coupled to receive a signal representative of the second intermediate signal and configured to generate a filtered signal; and
   a counter circuit coupled to receive the filtered signal, coupled to receive a clock signal, and configured to compare a phase of the clock signal with a phase of the filtered signal.

15. The magnetic field sensor of claim 14, wherein the x-y direction component processor further comprises an amplitude detector coupled to receive the filtered signal and configured to detect an amplitude of the filtered signal to generate an x-y magnitude signal representative of a magnitude of the direction component of the magnetic field in the x-y plane.

16. The magnetic field sensor of claim 15, wherein the amplitude detector comprises a rectifier coupled to a low pass filter.

17. The magnetic field sensor of claim 15, further comprising a combining processor coupled to receive the z magnitude signal, the x-y angle signal, and the x-y magnitude signal, and configured to combine the signals to generate a signal representative of a magnitude of the magnetic field along its pointing direction in three dimensions.

18. The magnetic field sensor of claim 15, further comprising a combining processor coupled to receive at least two of the z magnitude signal, the x-y angle signal, or the x-y magnitude signal and configured to format the at least two signals into a format comprising at least one of a SENT format, an I2C format, or a pulse width modulated (PWM) format.

19. The magnetic field sensor of claim 1, wherein each one of the plurality of planar Hall elements of the CPH structure comprises a respective group of planar Hall element contacts, wherein ones of the plurality of planar Hall elements share planar Hall element contacts with other ones of the plurality of planar Hall elements.

20. The magnetic field sensor of claim 1, wherein the common circular implant region of the CVH structure and the common implant region of the CPH structure are concentrically disposed upon the substrate.

21. The magnetic field sensor of claim 1, wherein each one of the plurality of planar Hall elements of the CPH structure is arranged upon the common circular implant region of the CVH structure.

* * * * *

UNITED STATES PATENT AND TRADEMARK OFFICE
CERTIFICATE OF CORRECTION

| | | |
|---|---|---|
| PATENT NO. | : 8,922,206 B2 | Page 1 of 1 |
| APPLICATION NO. | : 13/226694 | |
| DATED | : December 30, 2014 | |
| INVENTOR(S) | : Andreas Friedrich et al. | |

It is certified that error appears in the above-identified patent and that said Letters Patent is hereby corrected as shown below:

Specification

Column 1, line 43 delete "sensor" and replace with --sensors--.

Column 3, line 53 delete "showing magnetic" and replace with --showing a magnetic--.

Column 5, line 39 delete "elements 34" and replace with --element 34--.

Column 5, line 51 delete "elements 30" and replace with --element 30--.

Column 6, line 38 delete "an a" and replace with --and a--.

Column 6, line 44 delete "signals 56a" and replace with --signal 56a--.

Column 6, line 67 delete "signal 60 a" and replace with --signal 60a--.

Column 7, line 15 delete "be signal" and replace with --be a signal--.

Column 7, line 44 delete "part 104" and replace with --104--.

Column 8, line 37 delete "magnitude the" and replace with --magnitude of a--.

Column 10, line 1 delete "magnitude 13," and replace with --magnitude $B_{xy}$,--.

Column 11, line 13 delete "that that" and replace with --that the--.

Signed and Sealed this
Sixteenth Day of February, 2016

Michelle K. Lee
*Director of the United States Patent and Trademark Office*